United States Patent
Seibold

(10) Patent No.: US 10,706,623 B1
(45) Date of Patent: Jul. 7, 2020

(54) SYSTEMS AND METHODS FOR PREPARING A VIRTUAL THREE-DIMENSIONAL (3D) OBJECT FOR 3D PRINTING

(71) Applicant: Ansys, Inc., Canonsburg, PA (US)

(72) Inventor: Wolfgang Seibold, Lafayette, CO (US)

(73) Assignee: Ansys, Inc., Canonsburg, PA (US)

( * ) Notice: Subject to any disclaimer, the term of this patent is extended or adjusted under 35 U.S.C. 154(b) by 37 days.

(21) Appl. No.: 15/850,143

(22) Filed: Dec. 21, 2017

Related U.S. Application Data

(60) Provisional application No. 62/447,040, filed on Jan. 17, 2017.

(51) Int. Cl.
 *B33Y 50/00* (2015.01)
 *G06T 17/30* (2006.01)
 *G06T 17/10* (2006.01)
 *G01L 1/00* (2006.01)

(52) U.S. Cl.
 CPC .............. *G06T 17/30* (2013.01); *B33Y 50/00* (2014.12); *G01L 1/005* (2013.01); *G06T 17/10* (2013.01)

(58) Field of Classification Search
 CPC ......... G06T 17/30; G06T 17/10; B33Y 50/00; G01L 1/005
 See application file for complete search history.

(56) References Cited

U.S. PATENT DOCUMENTS

| | | | | |
|---|---|---|---|---|
| 6,397,922 B1* | 6/2002 | Sachs | ........................ | B22C 9/00 164/4.1 |
| 8,970,590 B1* | 3/2015 | Brennan | ................ | G06T 17/10 345/423 |
| 9,902,114 B2* | 2/2018 | Musuvathy | ........... | B29C 64/386 |
| 10,008,036 B2* | 6/2018 | Sundaram | ................ | G06T 17/10 |
| 10,216,172 B2* | 2/2019 | Arisoy | .................... | G06F 17/50 |
| 2003/0006534 A1* | 1/2003 | Taboas | ................ | A61F 2/30756 264/401 |
| 2011/0205583 A1* | 8/2011 | Young | ................... | B29C 64/386 358/1.15 |
| 2015/0193559 A1* | 7/2015 | Musuvathy | ........... | B29C 64/386 703/1 |

(Continued)

OTHER PUBLICATIONS

Stava, Ondrej, et al. "Stress relief: improving structural strength of 3D printable objects." ACM Transactions on Graphics (TOG) 31.4 (2012): 48. (Year: 2012).*

(Continued)

*Primary Examiner* — Michael D Masinick
(74) *Attorney, Agent, or Firm* — Jones Day

(57) ABSTRACT

Computer-implemented systems and methods for preparing a virtual three-dimensional (3D) object for 3D printing are provided. A hollowed-out representation of an input model is generated. The input model defines a solid virtual 3D object, and the hollowed-out representation comprises a shell and an internal volume that is a void. The internal volume is meshed to generate a polygonal mesh representation of the internal volume. A lattice microstructure corresponding to the polygonal mesh representation is generated by (i) replacing each edge of the polygonal mesh representation with a solid part, and (ii) uniting the solid parts to form the lattice microstructure. A lightweight representation of the input model is generated, where the lightweight representation comprises the shell and the lattice microstructure.

20 Claims, 13 Drawing Sheets

(56) References Cited

U.S. PATENT DOCUMENTS

2016/0200051 A1\* 7/2016 Urbanic ................. B29C 64/40
    264/308

OTHER PUBLICATIONS

Tao, Wenjin, and Ming C. Leu. "Design of lattice structure for additive manufacturing." 2016 International Symposium on Flexible Automation (ISFA). IEEE, 2016. (Year: 2016).\*

\* cited by examiner

SYSTEMS AND METHODS FOR PREPARING A VIRTUAL THREE-DIMENSIONAL (3D) OBJECT FOR 3D PRINTING

CROSS REFERENCE TO RELATED APPLICATIONS

The present application claims priority from U.S. provisional patent application 62/447,040 filed Jan. 17, 2017, the entirety of which is hereby incorporated by reference.

FIELD

The present description relates to computer-based techniques for preparing a virtual three-dimensional (3D) object for 3D printing.

BACKGROUND

Additive manufacturing technologies, such as 3D printing, are commonly used to construct physical objects based on virtual 3D objects (e.g. CAD models, etc.). Generally, such additive manufacturing technologies are used to convert design data of the virtual 3D object into a plurality of consecutively stacked, thin, cross-sectional layers. For example, a printing unit of a 3D printing device can move above a printing platform along the XY-plane according to coordinates specified by the virtual 3D object, such that a deposited material forms a correct shape at each cross-sectional layer. The printing unit moves layer-by-layer along the Z-axis, with the cross-sectional layers being stacked consecutively to form a physical object corresponding to the virtual 3D object.

SUMMARY

Computer-implemented systems and methods for preparing a virtual three-dimensional (3D) object for 3D printing are provided. In a computer-implemented method for preparing a virtual 3D object for 3D printing, a hollowed-out representation of an input model is generated using a processing system. The input model defines a solid virtual 3D object, and the hollowed-out representation comprises a shell and an internal volume that is a void. The internal volume is meshed using the processing system to generate a polygonal mesh representation of the internal volume. A lattice microstructure corresponding to the polygonal mesh representation is generated by (i) replacing each edge of the polygonal mesh representation with a solid part, and (ii) uniting the solid parts to form the lattice microstructure. A lightweight representation of the input model is generated using the processing system, where the lightweight representation comprises the shell and the lattice microstructure.

A system for preparing a virtual 3D object for 3D printing includes a processing system and computer-readable memory in communication with the processing system encoded with instructions for commanding the processing system to execute steps. In executing the steps, a hollowed-out representation of an input model is generated. The input model defines a solid virtual 3D object, and the hollowed-out representation comprises a shell and an internal volume that is a void. The internal volume is meshed to generate a polygonal mesh representation of the internal volume. A lattice microstructure corresponding to the polygonal mesh representation is generated by (i) replacing each edge of the polygonal mesh representation with a solid part, and (ii) uniting the solid parts to form the lattice microstructure. A lightweight representation of the input model is generated, where the lightweight representation comprises the shell and the lattice microstructure. In interrelated embodiments, the input model may be based on a physical real world object, or it may be a design object model intended for generating a new physical real world object. In other interrelated embodiments, the lightweight representation may serve as an input to a 3D printer for printing a physical 3D object based on the lightweight representation and having a lattice microstructure.

In a non-transitory computer-readable storage medium for preparing a virtual 3D object for 3D printing comprises computer executable instructions which, when executed, cause a processing system to execute steps. In executing the steps, a hollowed-out representation of an input model is generated. The input model defines a solid virtual 3D object, and the hollowed-out representation comprises a shell and an internal volume that is a void. The internal volume is meshed to generate a polygonal mesh representation of the internal volume. A lattice microstructure corresponding to the polygonal mesh representation is generated by (i) replacing each edge of the polygonal mesh representation with a solid part, and (ii) uniting the solid parts to form the lattice microstructure. A lightweight representation of the input model is generated, where the lightweight representation comprises the shell and the lattice microstructure. In interrelated embodiments, the input model may be based on a physical real world object, or it may be a design object model intended for generating a new physical real world object. In other interrelated embodiments, the lightweight representation may serve as an input to a 3D printer for printing a physical 3D object based on the lightweight representation and having a lattice microstructure.

The subject matter described herein provides many technical advantages. As described below, the computer-based techniques of the present disclosure enable the preparation of a relatively lightweight representation of a solid virtual 3D object. The lightweight representation includes an internal framework (e.g., a lattice microstructure) that replaces a solid interior of the solid virtual 3D object. Replacing the solid interior with the internal framework enables the creation of a physical object that corresponds to the virtual 3D object (e.g., via 3D printing) that uses less material. Further, replacing the solid interior with the internal framework enables the creation of a lighter physical object that still maintains an appropriate stiffness, rigidity, and strength. These technical advantages and others of the present disclosure are described in detail below. In interrelated embodiments, the input model may be based on a physical real world object, or it may be a design object model intended for generating a new physical real world object. In other interrelated embodiments, the lightweight representation may serve as an input to a 3D printer for printing a physical 3D object based on the lightweight representation and having a lattice microstructure.

The details of one or more variations of the subject matter described herein are set forth in the accompanying drawings and the description below. Other features and advantages of the subject matter described herein will be apparent from the description and drawings, and from the claims.

DETAILED DESCRIPTION

Figure 1:
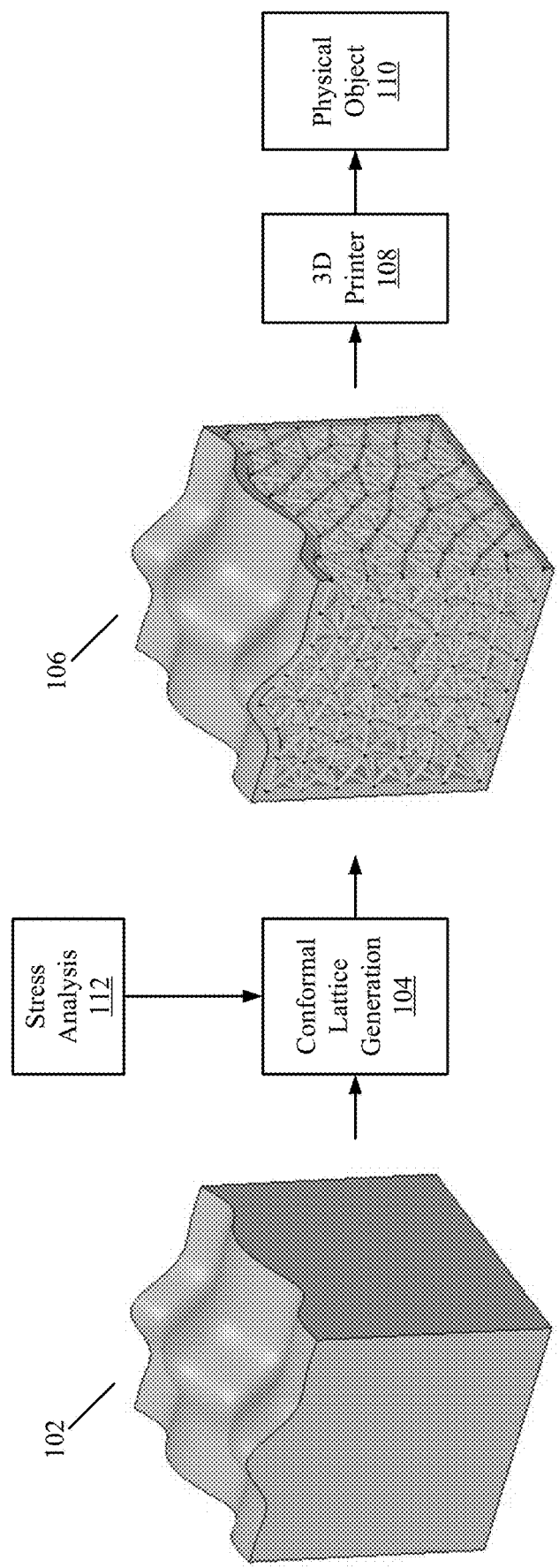
FIG. 1 is a block diagram illustrating the use of conformal lattice generation software to generate a lightweight representation of an input model, according to an embodiment of the present disclosure.

The present disclosure relates generally to computer-based techniques for preparing a virtual 3D object for 3D printing, and for printing a physical 3D object according to the prepared virtual 3D object. As described above, 3D printing techniques are commonly used to create physical objects corresponding to virtual 3D objects. For instance, a virtual 3D object or data derived therefrom is provided to a 3D printer, such that the 3D printer can be operated to create a physical object corresponding to the virtual 3D object (e.g., by successive deposition of multiple layers). In some conventional approaches, the data that is provided to the 3D printer corresponds to a solid virtual 3D object. In these conventional approaches, the resulting physical object printed by the 3D printer is a solid object having an internal volume that is filled with material. An amount of material needed to print such solid objects is relatively large, and the solid objects may be relatively heavy. These characteristics of the conventional techniques are generally undesirable.

The present inventor has observed a need for improved techniques for preparing a virtual 3D object for 3D printing. Specifically, the present inventor has observed a need for automated, computer-based techniques for generating a lightweight representation of a solid virtual 3D object. Embodiments of the present disclosure are directed to computer-implemented systems and methods that may satisfy this need. Accordingly, the present disclosure provides computer-implemented systems and methods for automatically generating a lightweight representation of a solid virtual 3D object that includes an internal framework (e.g., a lattice microstructure) that replaces the solid interior of the solid virtual 3D object. Data corresponding to the lightweight representation of the object may be provided to a 3D printer, and the resulting physical object printed by the printer uses less material as compared to comparable objects created according to the conventional approaches. The resulting physical object is lighter than comparable objects created according to the conventional approaches, yet still maintains an appropriate stiffness, rigidity, and strength.

Accordingly, the techniques of the present disclosure enable users (e.g., engineers, etc.) to take full advantage of the power of 3D printing in the context of creating strong yet lightweight parts automatically. 3D printing can produce models with complexities which traditional manufacturing methods are not capable of. As described in further detail below, a hollowed-out version (e.g., a shelled version) of an input model with open faces is created in a robust way that provides advantages over conventional CAD and polygonal shelling approaches. A volumetric mesh is re-interpreted as a lattice to produce an interior portion of the model. Further, the density and thickness of the lattice elements are controlled by results from computer simulation and analyses in several ways, thus creating a model that is strong and/or dense where it needs to be, yet porous and/or coarse where it can be. These steps are described in further detail below.

To illustrate features of the computer-implemented systems and methods described herein, reference is made to FIG. 1. This figure is a block diagram illustrating the use of conformal lattice generation software 104 to generate a lightweight representation of an input model, according to embodiments of the present disclosure. As illustrated in the figure, an input model 102 defining a solid virtual 3D object is received by the conformal lattice generation software 104. An internal volume of the model 102 is solid and thus filled with material. The conformal lattice generation software 104 generates a lightweight representation 106 of the input model 102 using algorithms described herein.

In embodiments, the lightweight representation 106 comprises a thin-walled shell and a lattice microstructure that fills an internal volume of the shell. With the lattice microstructure filling the internal volume, rather than solid material, the lightweight representation 106 is relatively porous, having a structure that is neither entirely solid nor entirely void. The lattice microstructure may be understood as comprising a connected array of support struts, with each of the struts being formed of a solid part. The solid parts may be, for example, cylinders, cones, or other types of solid parts.

As illustrated in FIG. 1, the lightweight representation 106 or data derived therefrom is provided to a 3D printer 108. The 3D printer 108 is operated to create a physical object 110 corresponding to the lightweight representation 106. The physical object 110 may resemble the lightweight representation 106 and may thus be relatively lightweight due to its porous nature. To ensure that the physical object 110 has an appropriate stiffness, rigidity, and/or strength, the conformal lattice generation software 104 may receive and process an output of a stress analysis 112. In embodiments, the output of the stress analysis 112 indicates amounts of stress at respective areas of the input model 102.

In some embodiments, based on the output of the stress analysis 112, the conformal lattice generation software 104 controls a density of support struts in the lightweight representation 106. For example, the conformal lattice generation software 104 may be configured to automatically generate the lightweight representation 106 having (i) a higher density of support struts in an area of the model having a higher amount of stress, and (ii) a lower density of support struts in an area of the model having a lower amount of stress. In embodiments, the conformal lattice generation software 104 analyzes (e.g., processes) the output of the stress analysis 112 and generates the lightweight representation 106 in an automated manner that requires no human intervention (or only minimal human intervention).

In some embodiments, based on the output of the stress analysis 112, the conformal lattice generation software 104 controls dimensions of support struts in the lightweight representation 106. For example, the conformal lattice generation software 104 may be configured to automatically generate the lightweight representation 106 having (i) cylinders or cones of larger radii in an area of the model having a higher amount of stress, and (ii) cylinders or cones of smaller radii in an area of the model having a lower amount of stress. In embodiments, the conformal lattice generation software 104 analyzes the output of the stress analysis 112 and generates the lightweight representation 106 in an automated manner that requires little or no human intervention.

As described in further detail below, the present disclosure provides computer-implemented techniques for creating a lightweight part from a solid part automatically. The solid part can be a traditional CAD model or a closed triangle mesh, for instance. The automatically generated lattice can be uniform or non-uniform if further density constraints are provided. In embodiments, a result of the computer-implemented techniques described herein is a boundary conformal lattice that does not have any tangling spurs, thus resulting in superior structural integrity. Furthermore, the generated lattice and hollowed-out model lends itself to straight-forward and fast structural analysis by leveraging shells and beams simulations. Additionally, new and robust algorithms for shelling an input model are described below.

Figure 2:
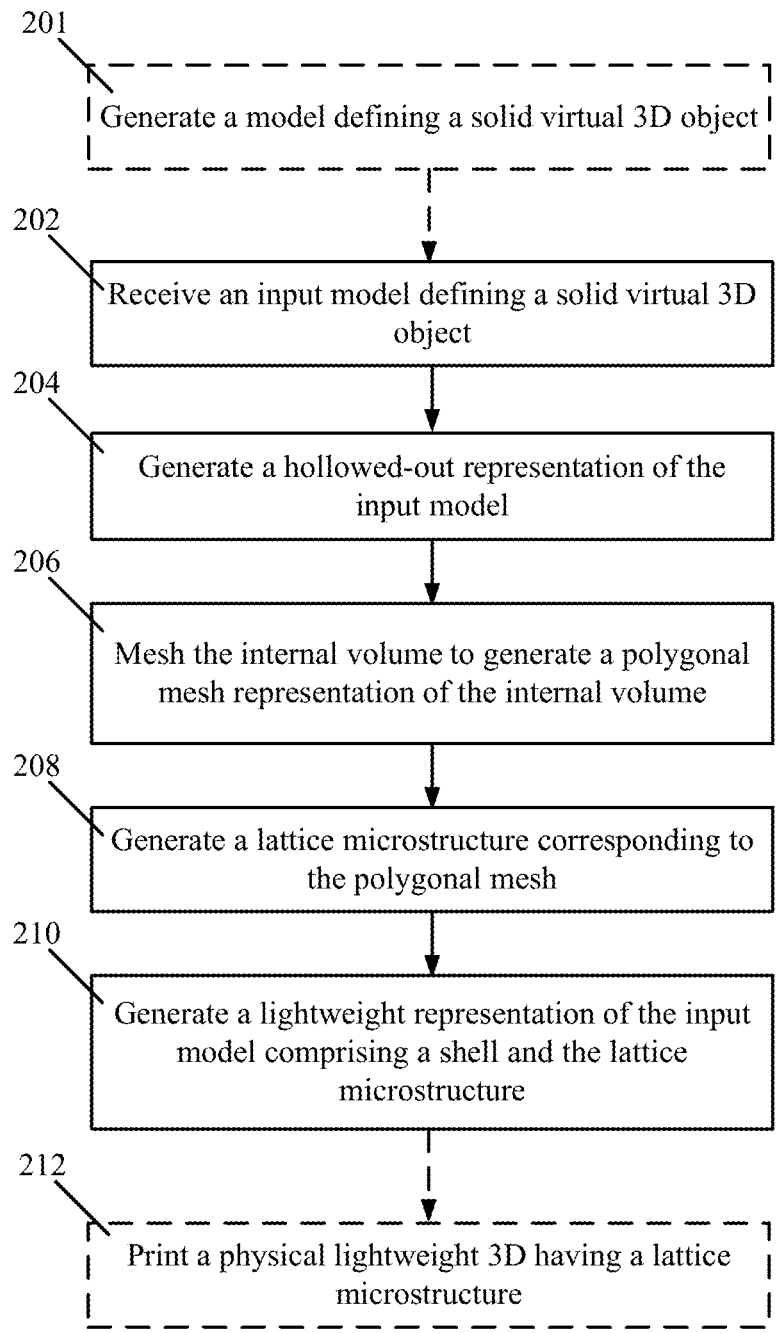
FIG. 2 is a flowchart including exemplary operations of a computer-implemented method for preparing a virtual 3D object for 3D printing, according to embodiments of the present disclosure.

To implement the technical advantages of the present disclosure, the computer-implemented operations of FIG. 2 are utilized, in embodiments. It is noted that in embodiments, some of the steps of FIG. 2 are performed simultaneously and not necessarily sequentially, and that in embodiments, the ordering of the steps varies from that depicted in the figure. At operation 201, a solid virtual 3D object model is generated. As an example, such a model may be generated by observing a physical object and creating a virtual object model using a CAD software such as ANSYS SPACECLAIM. In embodiments, a model may be generated by any suitable 3D scanner, such as by laser scanning a physical object to generate a point cloud that may be converted to a solid virtual 3D model using suitable design software. Alternatively, at operation 201, a sold virtual 3D model of a new physical object is generated, for example, as part of a design or prototyping process. In this way, an entirely new physical 3D object may be modeled as a solid virtual 3D object before it is realized in physical space. In this way, the new physical object may, in one of many examples, be employed and evaluated in various design simulations. By utilizing a new physical object in design simulations before expending time and resources to create a physical realization of the object, the virtual object may be tailored and modified in a virtual representation to fit the needs of the overall system design of which the new object may be a part of.

Figure 3:
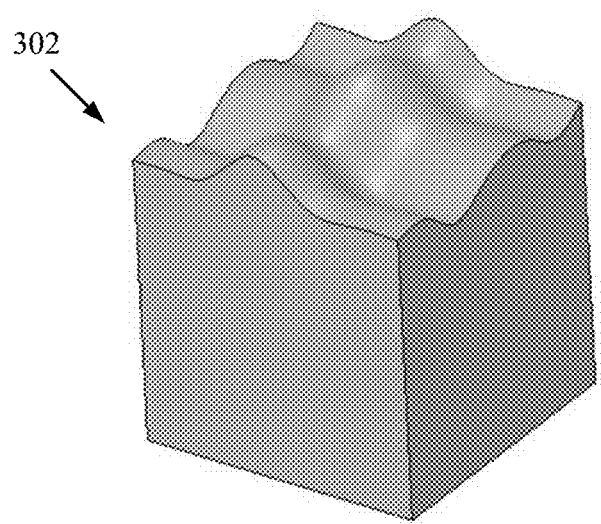
FIG. 3 depicts an example input model, according to an embodiment of the present disclosure.

At operation 202, an input model defining a solid virtual 3D object is received. An example of such an input model is illustrated in FIG. 3. As illustrated in this figure, the input model 302 is a solid object having an internal volume that is filled with material. The input model 302 is a CAD model that is closed.

Figure 4:
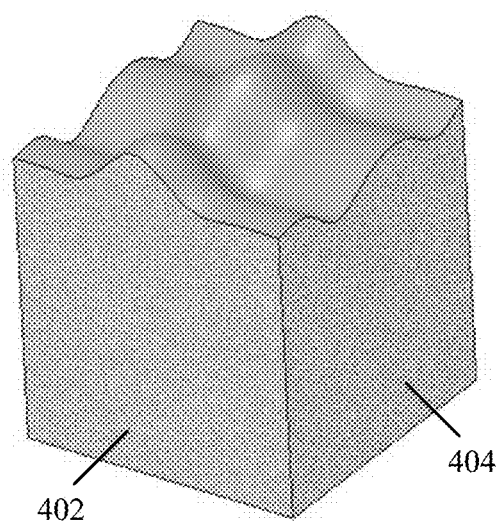
FIG. 4 depicts an example selection of faces of the input model of FIG. 3, according to an embodiment of the present disclosure.

In some embodiments, a selection of one or more faces of the input model is received. The one or more faces may be selected by a user via a graphical user interface (GUI), with the selected faces being faces that the user wishes to have removed (e.g., be open) in displays of the model that are subsequently presented to the user. In FIG. 4, for example, faces 402, 404 are faces of the input model 302 selected by the user, and in subsequent displays (e.g., example displays illustrated in FIGS. 5 and 10), these faces are removed. The removal of faces enables the user to view an interior portion of the model. It is noted that the algorithms described herein for creating the lightweight representation of the input model are not dependent on the user selecting faces for removal. In other words, the algorithms described herein are configured to generate the lightweight representation regardless of whether the user selects any faces.

Figure 5:
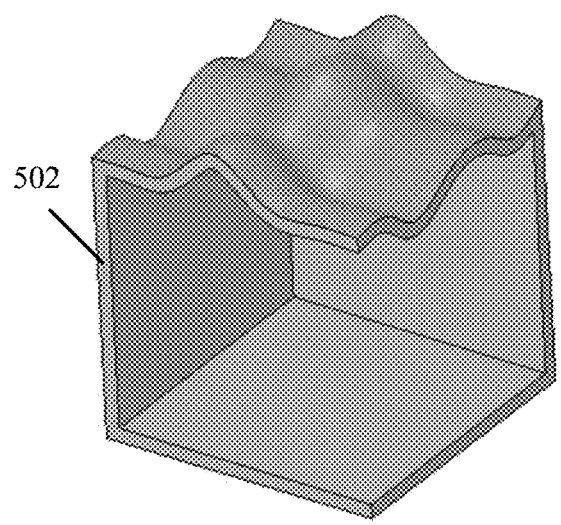
FIG. 5 depicts an example hollowed-out representation of the input model of FIG. 3, according to an embodiment of the present disclosure.

With reference again to FIG. 2, at operation 204, a hollowed-out representation of the input model is generated, where the hollowed-out representation comprises a shell and an internal volume that is a void. The hollowed-out representation may also be referred to as a "shelled version" of the input model. An example of such a hollowed-out representation is illustrated in FIG. 5. The hollowed-out representation shown in this figure comprises a thin-walled shell 502 having a uniform thickness and a void (e.g., empty, air-filled, etc.) interior. In the example of FIGS. 4 and 5, because the user has selected the faces 402, 404 shown in FIG. 4, the display of the hollowed-out representation shown in FIG. 5 does not include the selected faces 402, 404. This enables the user to view the void interior of the hollowed-out representation.

Figure 6:
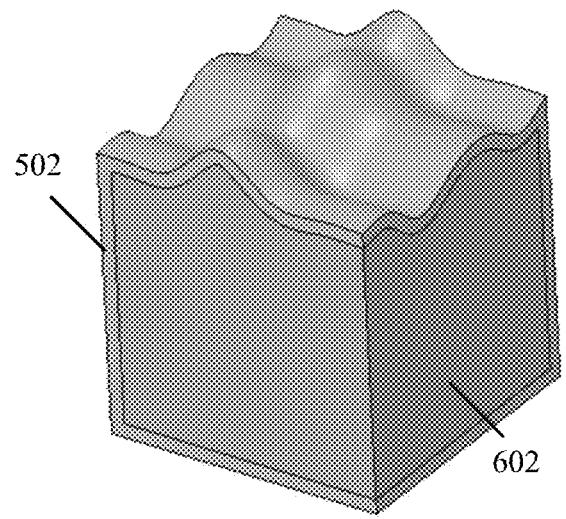
FIGS. 6 and 7 illustrate an internal volume of the hollowed-out representation of FIG. 5, according to an embodiment of the present disclosure.
Figure 7:
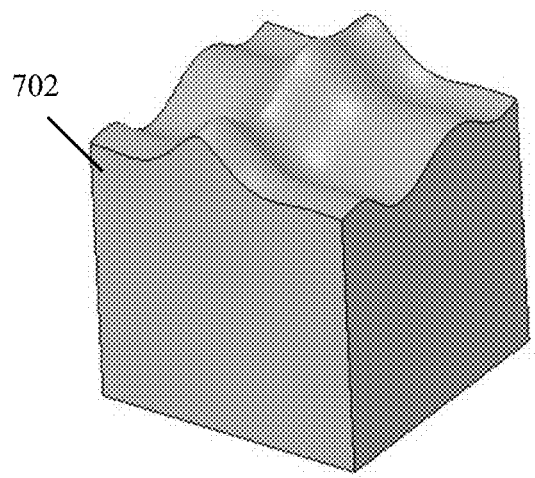

The void internal volume of the hollowed-out representation of FIG. 5 is further illustrated in FIGS. 6 and 7. In FIG. 6, the void internal volume 602 is shown as filling the shell 502, and in FIG. 7, the void internal volume 702 is removed from the shell 502 (i.e., the void internal volume 702 is displayed without the shell 502 formed over portions of it). The void internal volume 602, 702 illustrated in FIGS. 6 and 7, respectively, comprises the void that is subsequently filled with a boundary conformal lattice. The filling of this void with the boundary conformal lattice is described in further detail below with reference to FIGS. 8-10.

Figure 8:
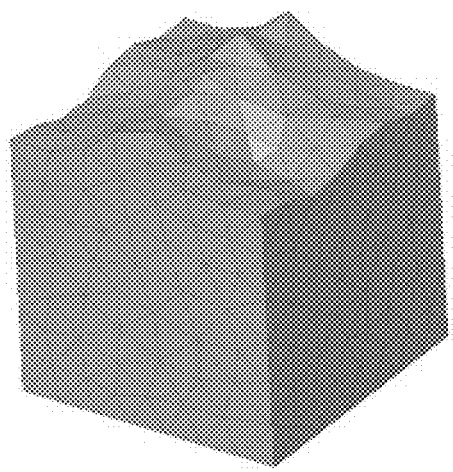
FIG. 8 depicts an example polygonal mesh representation of the internal volume of FIG. 7, according to an embodiment of the present disclosure.

With reference again to FIG. 2, at operation 206, the void internal volume of the hollowed-out representation is meshed using the processing system to generate a polygonal mesh representation of the internal volume. An example of such a polygonal mesh representation is illustrated in FIG. 8. In embodiments, the polygonal mesh representation (e.g., the polygonal mesh representation of FIG. 8) is a surface mesh, known to those of ordinary skill in the art. In embodiments, the void internal volume is meshed by a volumetric mesher using a uniform meshing technique, such that a density of edges in the resulting polygonal mesh does not vary (or varies only minimally) across the mesh.

In other embodiments, the volumetric mesher utilizes a density function to vary the mesh's density of edges across the mesh. For instance, as described in further detail below, in embodiments, an output of a stress analysis is provided to the volumetric mesher, and the volumetric mesher is configured to control a density of edges of the polygonal mesh representation based on the stress analysis output. By controlling the density of edges based on the stress analysis output, the volumetric mesher may generate a mesh having (i) a higher density of edges in areas having higher amounts of stress, and (ii) a lower density of edges in areas having a lower amounts of stress, for instance. In this manner, a lattice microstructure that is generated based on the mesh has increased strength in areas of higher stress and is more porous (e.g., lighter) in areas of lower stress. As described in further detail below, in embodiments, the density of the volumetric mesh is controlled via size functions (e.g., user-defined size functions, size functions generated automatically by software, etc.).

Figure 9:
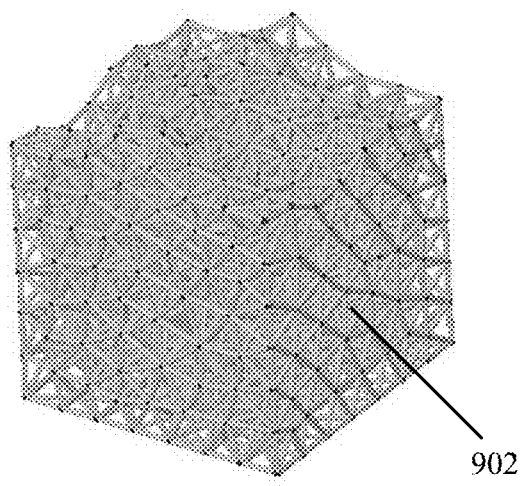
FIG. 9 depicts an example lattice microstructure corresponding to the polygonal mesh representation of FIG. 8, according to an embodiment of the present disclosure.

With reference again to FIG. 2, at operation 208, a lattice microstructure corresponding to the polygonal mesh representation is generated by (i) replacing each edge of the polygonal mesh representation with a solid part, and (ii) uniting the solid parts to form the lattice microstructure. An example of such a lattice microstructure is illustrated in FIG. 9. In embodiments, each of the solid parts of the lattice microstructure comprises a cylinder, a cone, or a part having another geometry. Further, in embodiments, the lattice microstructure (e.g., the lattice microstructure of FIG. 9) comprises a boundary conformal lattice, known to those of ordinary skill in the art.

The example lattice microstructure 902 of FIG. 9 does not have any vertices which are not connected to at least three other vertices, as would be seen in broken-ligament lattices. The lattice 902 of FIG. 9 is generated by replacing every edge of the volumetric mesh of FIG. 8 with a cylinder and then uniting the cylinders to create a valid solid. In some embodiments, one or more dimensions of the solid parts of the lattice microstructure are controlled (e.g., based on input from a user, based on input from an automated, computer-implemented algorithm, etc.) to cause the lattice to have varying strengths in different parts of the lattice. For instance, in the context of FIG. 9, where the lattice microstructure 902 comprises a collection of cylinders, radii of the cylinders can be controlled by the user to give varying strengths in different parts of the lattice.

Additionally, as described in further detail below, in some embodiments, one or more dimensions of the solid parts of the lattice microstructure are controlled based on an output of a stress analysis or another type of simulation or analysis. For instance, in an example where the lattice microstructure comprises cylinders or cones, the lattice microstructure may be engineered to include (i) cylinders or cones of larger radii in areas having a higher amount of stress, and (ii) cylinders or cones of smaller radii in areas having a lower amount of stress. In this manner, the lattice microstructure has increased strength in areas of higher stress and a lower strength in areas of lower stress.

Although the example of FIG. 9 illustrates the lattice microstructure 902 as being comprised of cylinders, in other embodiments, the cylinders are replaced with cones, thus allowing two different radii per volumetric mesh edge. The use of two different radii for each edge allows for even more control over strength.

Figure 10:
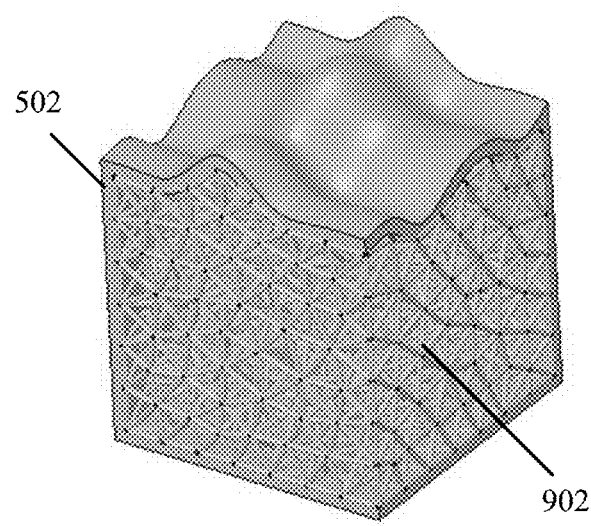
FIG. 10 depicts an example lightweight representation of the input model of FIG. 3, according to an embodiment of the present disclosure.

With reference again to FIG. 2, at operation 210, a lightweight representation of the input model is generated using the processing system, where the lightweight representation comprises the shell and the lattice microstructure. An example of such a lightweight representation is illustrated in FIG. 10. As seen in this figure, the lightweight representation unites the lattice with the shelled model and thus comprises the thin-walled shell 502 (e.g., described above with reference to FIGS. 5 and 6) and the lattice microstructure 902 (e.g., described above with reference to FIG. 9). Based on the lightweight representation of the input model, at operation 212, a physical 3D object is printed having an internal volume determined by the lightweight representation. The printed physical 3D object may be a replica of a physical 3D object that was modeled in step 201, or it may be an entirely new physical 3D object that was modeled based on designed considerations. The printed object may then be subjected to physical, aesthetic, or other tests and evaluations to identify desired modification which may then be implemented by modifying the virtual 3D model according to one or more techniques disclosed herein before reprinting a modified physical 3D object.

Figure 11:
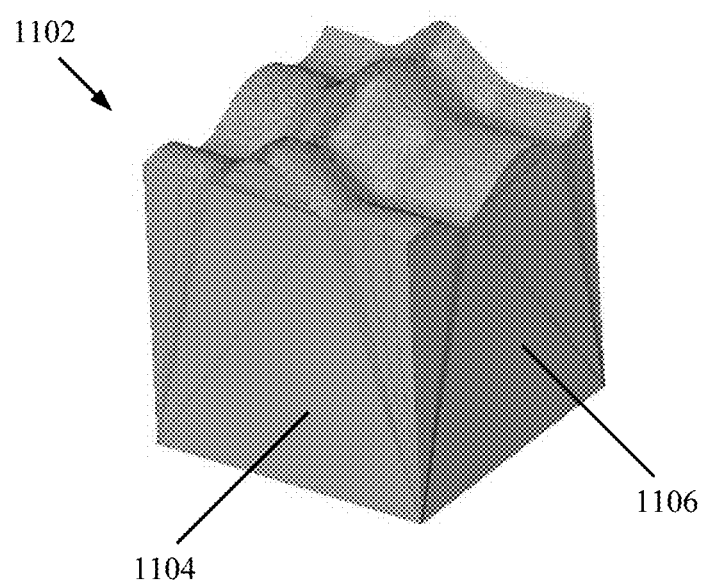
FIG. 11 depicts another example input model comprising a closed triangle mesh, according to an embodiment of the present disclosure.

In the example of FIGS. 3-10, a lightweight representation of the input model 302 is generated, where the input model 302 comprises a closed CAD model. In other embodiments, the input model comprises a closed triangle model. To illustrate these other embodiments, reference is made to FIGS. 11-15. In FIG. 11, input model 1102 is shown. The input model 1102 is similar to the input model 302 of FIG. 3, but instead of being a CAD model, the input model 1102 is a closed triangle model.

Figure 12:
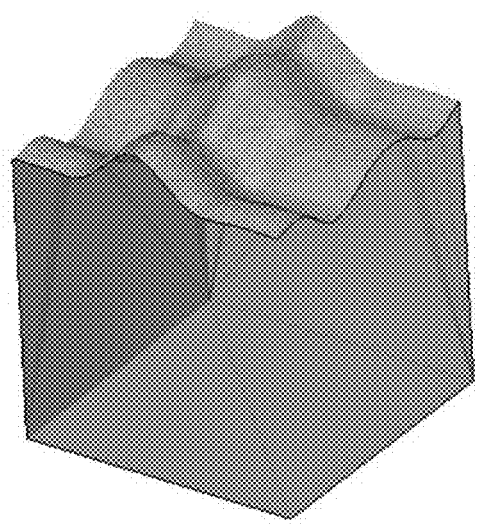
FIG. 12 depicts an example selection of triangles of the input model of FIG. 11, according to an embodiment of the present disclosure.

In embodiments, a selection of one or more triangles of the input model 1102 is received. The one or more triangles may be selected by a user via a GUI, with the selected triangles being triangles that the user wishes to have removed (e.g., be open) in displays of the model that are subsequently presented to the user. For example, triangles seen at 1104, 1106 may be selected by the user, and FIG. 12 shows the result after the deletion of the user-selected triangles (e.g., open triangles). It is noted that the algorithms described herein for creating the lightweight representation of the input model 1102 are not dependent on the user selecting triangles for removal. In other words, the algorithms described herein are configured to generate the lightweight representation regardless of whether the user selects any triangles.

Figure 13:
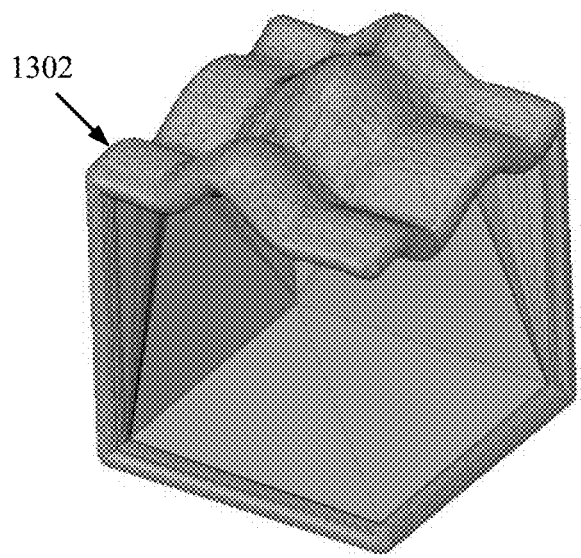
FIG. 13 depicts an example offset model, according to an embodiment of the present disclosure.
Figure 14:
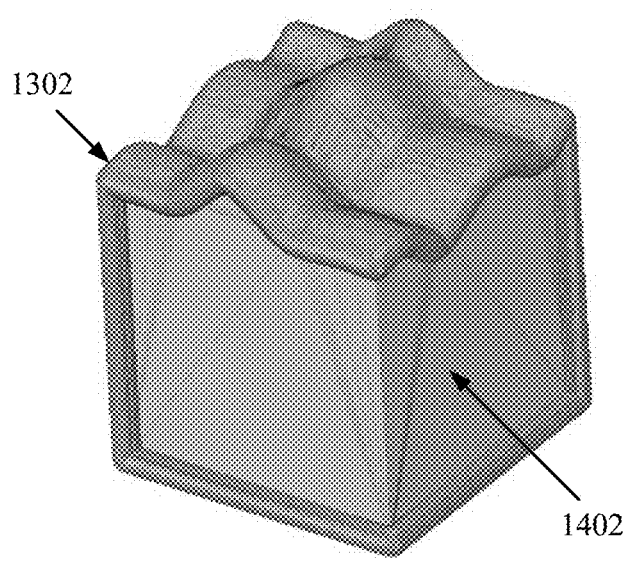
FIG. 14 depicts a combination of the closed triangle mesh of FIG. 11 and the offset model of FIG. 13, according to an embodiment of the present disclosure.
Figure 15:
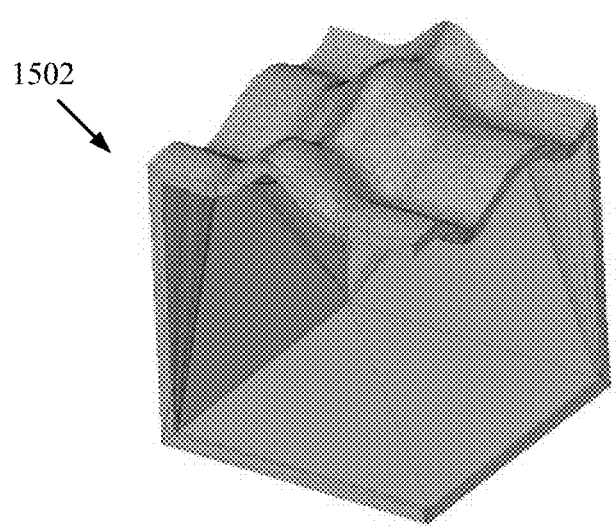
FIG. 15 depicts an example hollowed-out representation of the input model of FIG. 11, according to an embodiment of the present disclosure.

A hollowed-out representation of the input model 1102 is generated. In embodiments, an approach to generating the hollowed-out representation that differs from conventional shelling techniques is utilized. In this approach, the closed triangle mesh 1102 is offset by a predetermined distance (e.g., a constant distance field, a user-defined thickness value, etc.) to generate an offset model. FIG. 13 shows the result of offsetting the mesh 1102 by a constant distance field (e.g., user defined thickness value) to generate an offset model 1302. Next, an intersection between the closed triangle mesh 1102 and the offset model 1302 is determined, with the intersection defining the hollowed-out representation of the closed triangle mesh 1102. To illustrate this, reference is made to FIGS. 14 and 15. FIG. 14 shows the original model at 1402 with the offset model 1302 of FIG. 13. The hollowed-out representation 1502 (i.e., open shelling result) shown in FIG. 15 is the intersection between the original model 1402 and the offset model 1302 shown in FIG. 13. This construction is well-defined and does not suffer the same drawbacks as some conventional shelling techniques, which may be limited by the curvature of the input model's surfaces.

After the hollowed-out representation 1502 is generated, operations similar to those described above with reference to FIGS. 6-10 are performed to generate the lightweight representation of the input model 1102. These operations include the operations 206, 208, 210 described above with reference to FIG. 2, among others. For brevity, the description of these operations is not repeated here.

FIGS. 1-15 and their associated text describe algorithms for generating a lightweight version from a given solid model (e.g., CAD or mesh). In these algorithms, the interior is filled with a uniform lattice to achieve weight reduction but preserve strength. In embodiments, the generation of the lattice is driven by various analyses and data. For instance, output from stress analyses or other analyses may be used to generate a lattice microstructure having an increased strength in areas of higher stress and a lower strength in areas of lower stress. As described below, the strength of the lattice may be engineered by varying a density of the lattice, sizes of lattice elements (e.g., varying radii of the lattice's cylinders or cones, etc.), or both. To illustrate this, reference is made to FIGS. 16-22.

Figure 16:
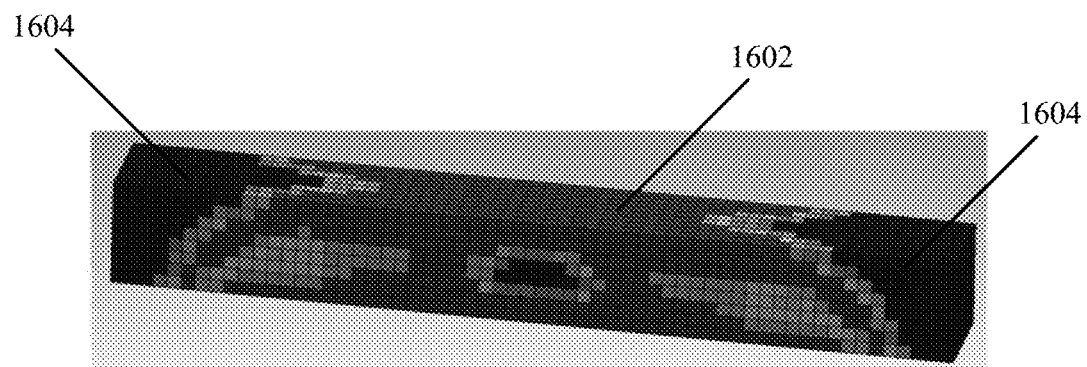
FIGS. 16-22 illustrate example methods for using analysis data (e.g., stress analysis data) to drive the creation of a lattice.
Figure 17:
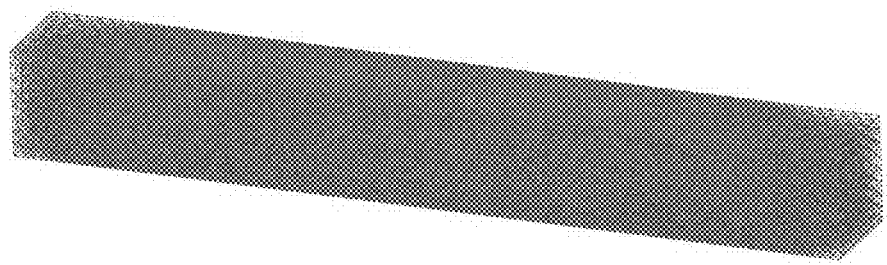
Figure 18:
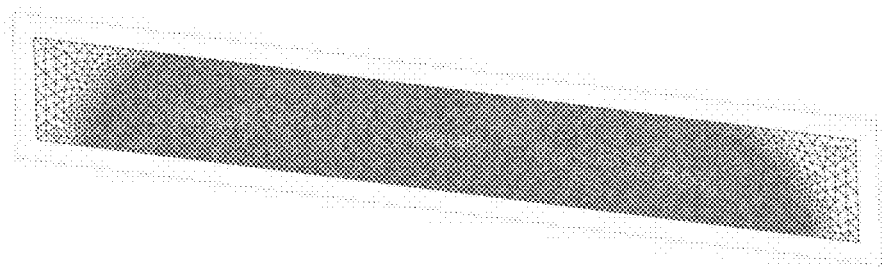
Figure 19:
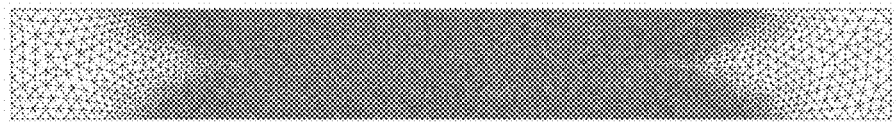
Figure 20:
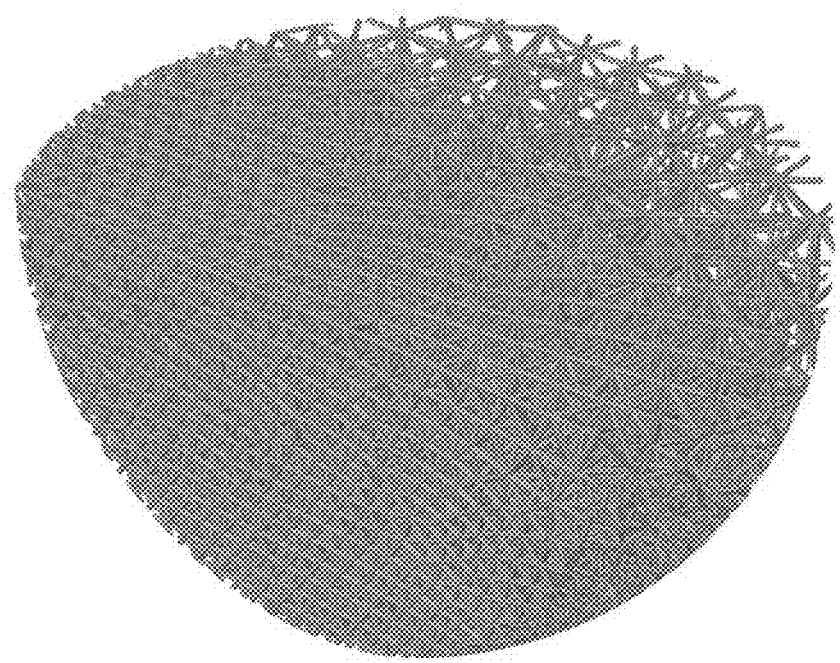

As is customary with Finite Element Analysis (FEA) result models, FIG. 16 shows the stress distribution for given boundary conditions on a supported bar model, with areas 1602 being areas high stress and areas 1604 being areas of low stress. FIG. 17 shows the resulting lattice model when the analysis result data illustrated in FIG. 16 is used to constrain the lattice creation. The result has more and shorter (e.g., stronger, less susceptible to buckling) lattice elements in high stress areas and less and longer (e.g., weaker, where the part is not likely to locally buckle) lattice elements in low stress regions. This distribution has been achieved by providing a size field to the volumetric mesher, which generates the volumetric mesh from which the lattice model is derived. FIGS. 18-20 show cross sections through the model and a cut-out to visualize the lattice distribution better.

To expand further on the way these lattices are created, the stress at any point in the volume is known as a scalar value, and this is known as a size field. Volumetric meshers can create uniform-density 3D tetrahedron-shaped internal meshes (or sets of connected lines) as is generally required to subdivide volumes (to create the Finite Elements) and prepare a 3D model for analysis. The output of this meshing (or 3D tetrahedron creation operation) can be interpreted as a set of 3D lines, and these lines can be used as the centers for the placement of cylinders. FIG. 8 (described above) appears to illustrate triangles on the outside of the solid, but the visible triangles are actually the side faces of many tetrahedrons. FIG. 9 (described above) shows the cylinders that are created along the edges of all these tetrahedrons.

Figure 21:
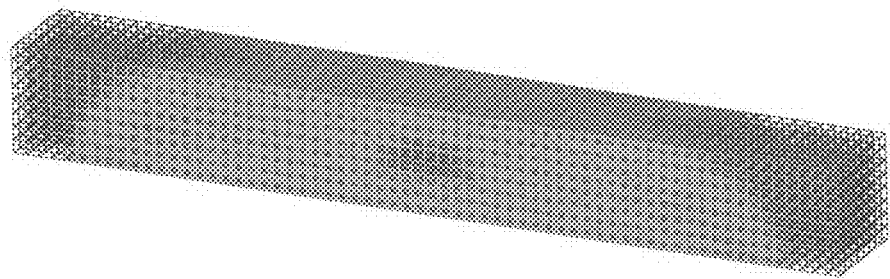
Figure 22:
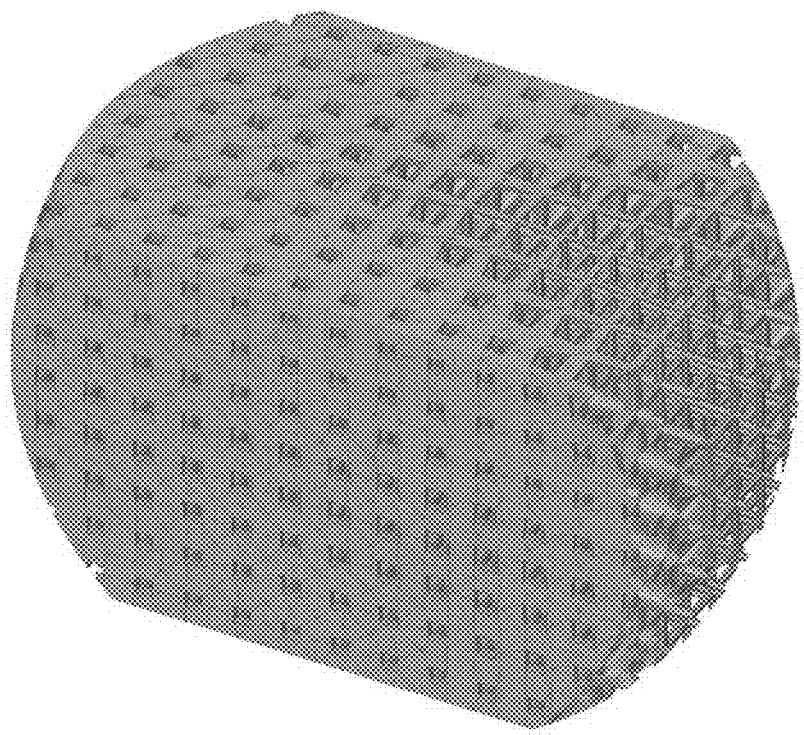

As noted above, the thickness of the lattice elements are varied in some embodiments. FIG. 21 shows the result of the bar model with lattice thickness derived from the density field of the stress analysis. FIG. 22 shows a volume clip to better illustrate the density variations.

In the variable case at FIG. 20, the stress, calculated from a uniform-density volume mesh, is used to create a set of internal cubes whose sides correspond to the stress at those locations (in the result field). Again, the cylinders are created at the edges of the tetrahedrons, and it does not matter that the side lengths of these are different. In the variable case most clearly seen at FIG. 21, a further variation is shown. Instead of creating a 3D set of variable-sized cubes (in this case, instead of tetrahedrons) from the result analysis, cones are created along the constant-sized cubes. Since the lengths of the elements are constant, cones are used to change the thickness according to the stiffness that is required. It is noted that the method of mesh creation for the initial FEA analysis does not have to correspond to the ultimate lattice structure. The size field is calculated however it is calculated (e.g., using cubes or tetrahedrons or whatever-shaped FEA elements) and that size field drives the lattice density, thickness, or both in order to obtain the required strength in the lightened 3D lattice (e.g., where the lattice can itself be any user-specified periodic 3D arrangement).

As can be appreciated from the description above, the present disclosure addresses numerous issues. These issues include, for instance, how to generate a boundary conformal lattice model with shelled regions without broken ligaments, where every vertex in the lattice is connected to at least three other vertices. This issue is addressed by using a volumetric mesh which conforms to the boundary of the original model. The present disclosure further enables the creation of both lattice infills as well as shelled components of the original model. Additionally, the present disclosure addresses the issue of robust open shelling. In general, open shelling of solid models is a difficult problem. The present disclosure addresses this problem by defining the open shell as a volumetric distance field intersected with the original model. This approach guarantees the success of the operation even in cases where conventional shelling techniques fail. Another aspect of the present disclosure is that the generated lattice can be non-uniform given appropriate sizing functions used in the generation of the surface and volumetric mesh. The present disclosure further enables a simple integration with existing simulation approaches like shell and beam analysis.

Figure 23A:
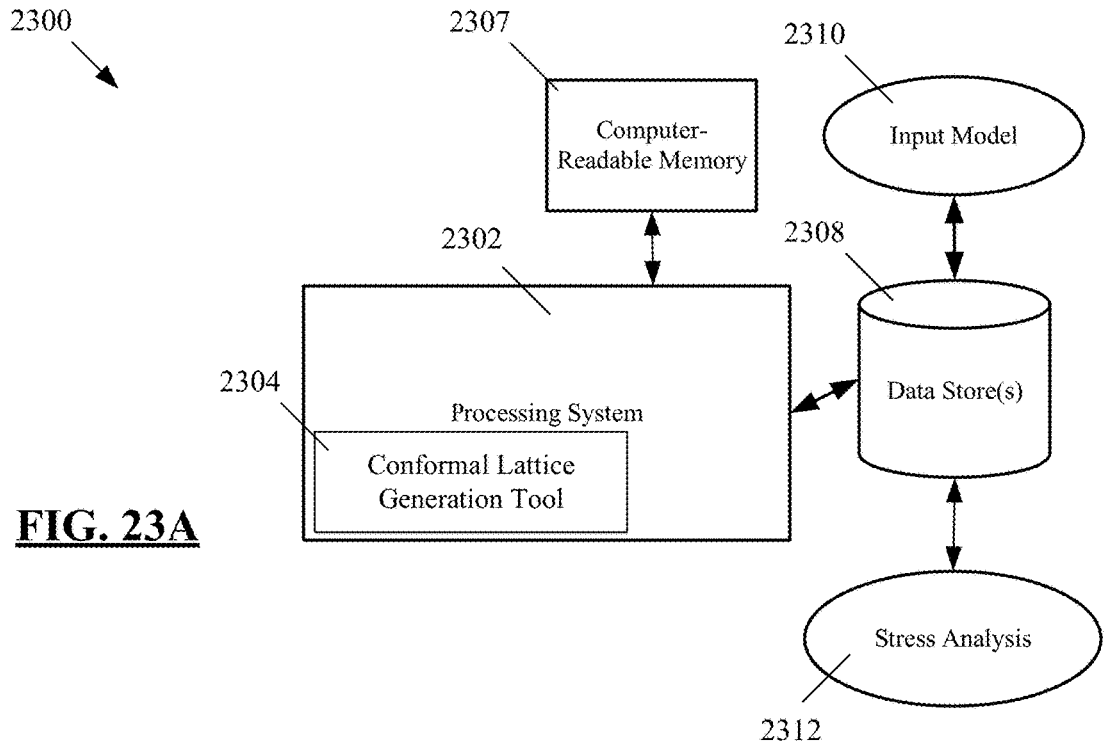
FIGS. 23A, 23B, and 23C depict example systems for implementing the techniques described herein.
Figure 23B:
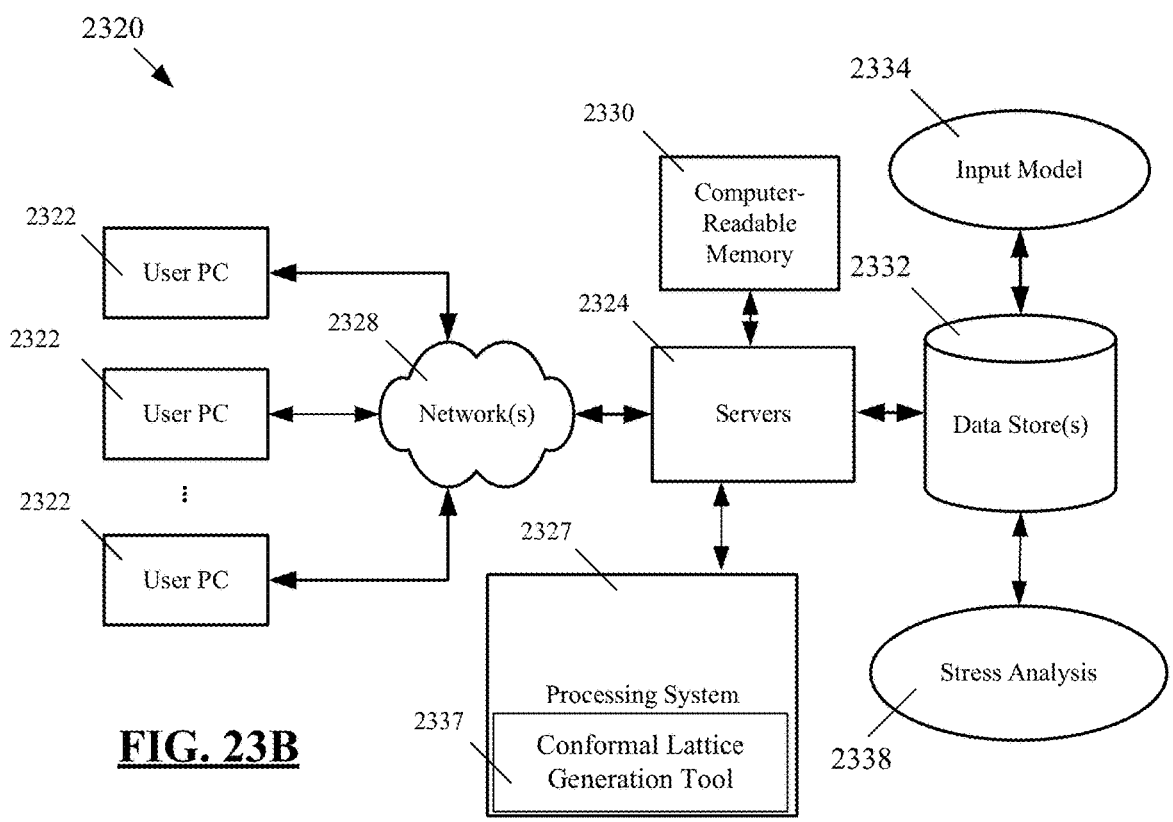
Figure 23C:
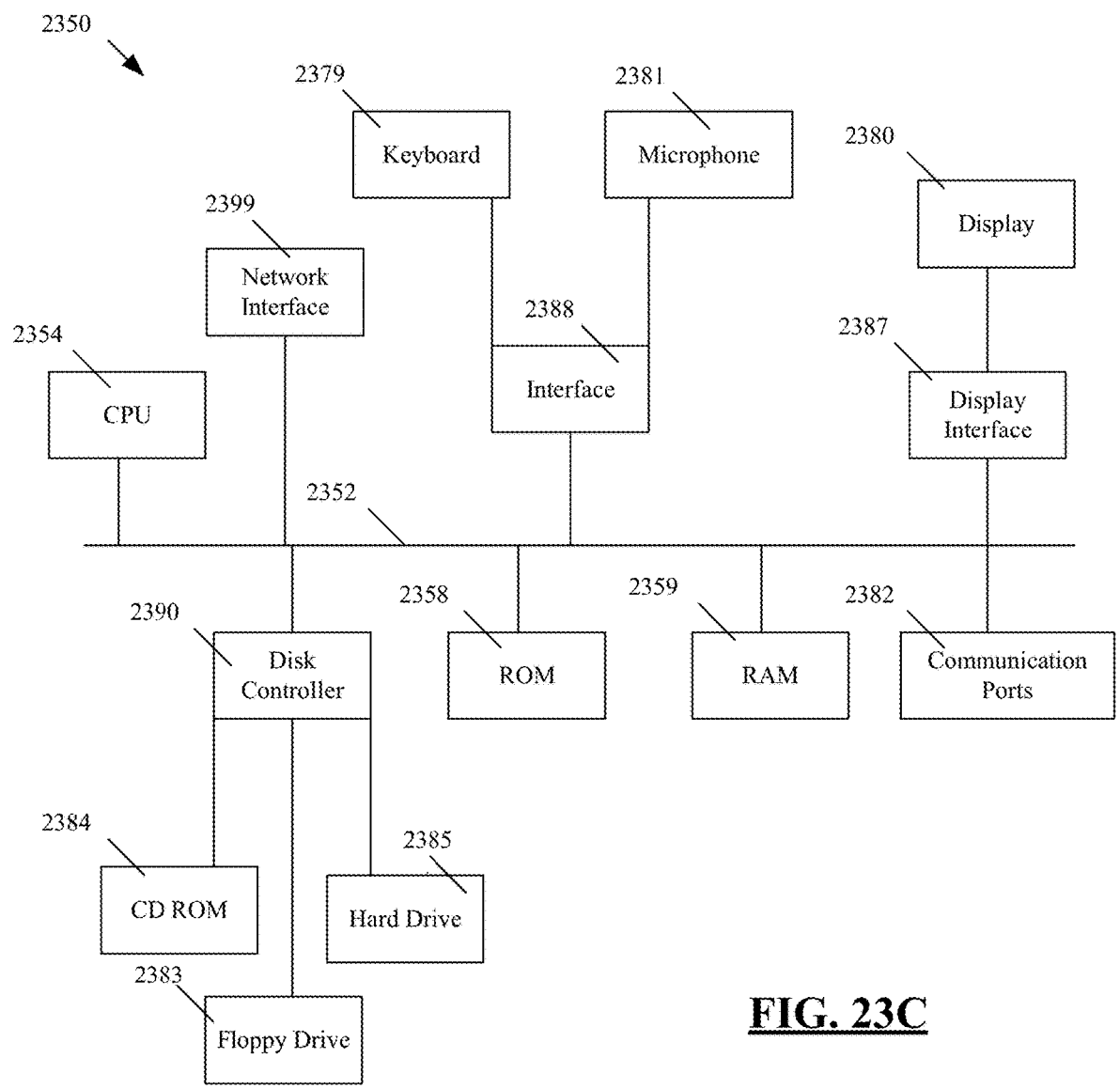

FIGS. 23A, 23B, and 23C depict example systems for implementing the techniques described herein. For example, FIG. 23A depicts an exemplary system 2300 that includes a standalone computer architecture where a processing system 2302 (e.g., one or more computer processors located in a given computer or in multiple computers that may be separate and distinct from one another) includes a conformal lattice generation tool 2304 being executed on the processing system 2302. The processing system 2302 has access to a computer-readable memory 2307 in addition to one or more data stores 2308. The one or more data stores 2308 may include an input model 2310 as well as data from a stress analysis 2312. The processing system 2302 may be a distributed parallel computing environment, which may be used to handle very large-scale data sets.

FIG. 23B depicts a system 2320 that includes a client-server architecture. One or more user PCs 2322 access one or more servers 2324 running a conformal lattice generation tool 2337 on a processing system 2327 via one or more networks 2328. The one or more servers 2324 may access a computer-readable memory 2330 as well as one or more data stores 2332. The one or more data stores 2332 may include data for an input model 2334 as well as data from a stress analysis 2338.

FIG. 23C shows a block diagram of exemplary hardware for a standalone computer architecture 2350, such as the architecture depicted in FIG. 23A that may be used to include and/or implement the program instructions of system embodiments of the present disclosure. A bus 2352 may serve as the information highway interconnecting the other illustrated components of the hardware. A processing system 2354 labeled CPU (central processing unit) (e.g., one or more computer processors at a given computer or at multiple computers), may perform calculations and logic operations required to execute a program. A non-transitory processor-readable storage medium, such as read only memory (ROM) 2358 and random access memory (RAM) 2359, may be in communication with the processing system 2354 and may include one or more programming instructions for performing methods (e.g., algorithms) for preparing a virtual 3D object for 3D printing. Optionally, program instructions may be stored on a non-transitory computer-readable storage medium such as a magnetic disk, optical disk, recordable memory device, flash memory, or other physical storage medium.

In FIGS. 23A, 23B, and 23C, computer readable memories 2307, 2330, 2358, 2359 or data stores 2308, 2332, 2383, 2384 may include one or more data structures for storing and associating various data used in the example systems for preparing a virtual 3D object for 3D printing. For example, a data structure stored in any of the aforementioned locations may be used to store data for an input model and/or data from a stress analysis. A disk controller 2390 interfaces one or more optional disk drives to the system bus 2352. These disk drives may be external or internal floppy disk drives such as 2383, external or internal CD-ROM, CD-R, CD-RW or DVD drives such as 2384, or external or internal hard drives 2385. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 2390, the ROM 2358 and/or the RAM 2359. The processor 2354 may access one or more components as required.

A display interface 2387 may permit information from the bus 2352 to be displayed on a display 2380 in audio, graphic, or alphanumeric format. Communication with external devices may optionally occur using various communication ports 2382.

In addition to these computer-type components, the hardware may also include data input devices, such as a keyboard 2379, or other input device 2381, such as a microphone, remote control, pointer, mouse and/or joystick. Such data input devices communicate with the standalone computer architecture 2350 via an interface 2388, in some embodiments. The standalone computer architecture 2350 further includes a network interface 2399 that enables the architecture 2350 to connect to a network, such as a network of the one or more networks 2328.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C, C++, JAVA, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A computer-implemented method for printing a 3D object based on a virtual three dimensional (3D) object, the method comprising:
    generating a hollowed-out representation of an input model using a processing system, the input model defining a solid virtual 3D object, and the hollowed-out representation comprising a shell and an internal volume that is a void;
    meshing the internal volume to generate a polygonal mesh representation of the internal volume according to an output of a stress analysis for the input model, the output indicating amounts of stress at respective areas of the input model, wherein a density of edges in the polygonal mesh representation is controlled based on the output;
    generating, using the processing system, a lattice microstructure corresponding to the polygonal mesh representation by (i) replacing each edge of the polygonal mesh representation with a solid part, and (ii) uniting solid parts for the edges of the polygonal mesh representation to form the lattice microstructure, wherein the solid parts comprise cones; and
    generating a lightweight representation of the input model using the processing system, the lightweight representation comprising the shell and the lattice microstructure.

2. The computer-implemented method of claim 1, further comprising:
    providing the lightweight representation of the input model to a 3D printer; and
    operating the 3D printer to create a physical object corresponding to the lightweight representation of the input model.

3. The computer-implemented method of claim 1, wherein the input model comprises a computer-aided design (CAD) model obtained based on observations of a physical object.

4. The computer-implemented method of claim 1, wherein the input model comprises a closed triangle mesh.

5. The computer-implemented method of claim 4, wherein the generating of the hollowed-out representation of the input model comprises:
    offsetting the closed triangle mesh by a predetermined distance to generate an offset model; and
    determining an intersection between the closed triangle mesh and the offset model, wherein the intersection defines the hollowed-out representation of the input model.

6. The computer-implemented method of claim 1, further comprising:
    receiving a selection of one or more faces or triangles of the input model; and
    generating a display of the hollowed-out representation of the input model, wherein the display does not include the selected one or more faces or triangles.

7. The computer-implemented method of claim 1, wherein at least one of the solid parts of the lattice microstructure comprises a cylinder.

8. The computer-implemented method of claim 1, wherein a volumetric mesher is configured to generate the polygonal mesh representation having (i) a higher density of edges in an area of the input model having a higher amount of stress, and (ii) a lower density of edges in an area of the input model having a lower amount of stress.

9. The computer-implemented method of claim 7, wherein the generating of the lattice microstructure comprises:
    controlling one or more dimensions of the solid parts of the lattice microstructure based on an output of a stress analysis for the input model.

10. The computer-implemented method of claim 9, wherein
    (i) cylinders or cones of larger radii in an area of the input model having a higher amount of stress, and (ii) cylinders or cones of smaller radii in an area of the input model having a lower amount of stress.

11. The method of claim 1, wherein the solid parts comprises cones in an area of the input model having a higher amount of stress have a radii larger than cones in an area of the input model having a lower amount of stress.

12. A system for preparing a virtual 3D object for 3D printing, the system comprising:
    a processing system; and
    computer-readable memory in communication with the processing system encoded with instructions for commanding the processing system to execute steps comprising:
    generating a hollowed-out representation of an input model using a processing system, the input model defining a solid virtual 3D object, and the hollowed-out representation comprising a shell and an internal volume that is a void;
    meshing the internal volume to generate a polygonal mesh representation of the internal volume according to an output of a stress analysis for the input model, the output indicating amounts of stress at respective areas of the input model, wherein a density of edges in the polygonal mesh representation is controlled based on the output;
    generating a lattice microstructure corresponding to the polygonal mesh representation by (i) replacing each edge of the polygonal mesh representation with a solid part, and (ii) uniting solid parts for the edges of the polygonal mesh representation to form the lattice microstructure, wherein the solid parts comprises cones; and generating a lightweight representation of the input model using the processing system, the lightweight representation comprising the shell and the lattice microstructure.

13. The system of claim 12, wherein the input model comprises a CAD model.

14. The system of claim 12, wherein the input model comprises a closed triangle mesh.

15. The system of claim 14, wherein the generating of the hollowed-out representation of the input model comprises:
   offsetting the closed triangle mesh by a predetermined distance to generate an offset model; and
   determining an intersection between the closed triangle mesh and the offset model, wherein the intersection defines the hollowed-out representation of the input model.

16. The system of claim 12, wherein the steps further comprise:
   receiving a selection of one or more faces or triangles of the input model; and
   generating a display of the hollowed-out representation of the input model, wherein the display does not include the selected one or more faces or triangles.

17. The system of claim 12, wherein at least one of the solid parts of the lattice microstructure comprises a cylinder.

18. The system of claim 12, wherein the generating of the lattice microstructure comprises:
   controlling one or more dimensions of the solid parts of the lattice microstructure based on an output of a stress analysis for the input model.

19. A non-transitory computer-readable storage medium for preparing a virtual 3D object for 3D printing, the computer-readable storage medium comprising computer executable instructions which, when executed, cause a processing system to execute steps comprising:
   generating a hollowed-out representation of an input model, the input model defining a solid virtual 3D object, and the hollowed-out representation comprising a shell and an internal volume that is a void;
   meshing the internal volume to generate a polygonal mesh representation of the internal volume according to an output of a stress analysis for the input model, the output indicating amounts of stress at respective areas of the input model, wherein a density of edges in the polygonal mesh representation is controlled based on the output;
   generating a lattice microstructure corresponding to the polygonal mesh representation by (i) replacing each edge of the polygonal mesh representation with a solid part, and (ii) uniting solid parts for the edges of the polygonal mesh representation to form the lattice microstructure, wherein the solid parts comprise cones, and (iii) controlling one or more dimensions of the solid parts of the lattice microstructure based on the output of the stress analysis for the input model; and
   generating a lightweight representation of the input model using the processing system, the lightweight representation comprising the shell and the lattice microstructure.

20. The non-transitory computer-readable storage medium of claim 19, wherein the solid parts comprises cones in an area of the input model having a higher amount of stress have a radii larger than cones in an area of the input model having a lower amount of stress.

* * * * *